US011400644B2

(12) United States Patent
Feller et al.

(10) Patent No.: US 11,400,644 B2
(45) Date of Patent: Aug. 2, 2022

(54) REDUCTION OF POLYMERIZATION INHIBITOR IRREGULARITY ON ADDITIVE MANUFACTURING WINDOWS

(71) Applicant: Carbon, Inc., Redwood City, CA (US)

(72) Inventors: Bob E. Feller, San Mateo, CA (US); R. Griffin Price, Redwood City, CA (US)

(73) Assignee: Carbon, Inc., Redwood City, CA (US)

( * ) Notice: Subject to any disclaimer, the term of this patent is extended or adjusted under 35 U.S.C. 154(b) by 0 days.

(21) Appl. No.: 16/490,137

(22) PCT Filed: Oct. 24, 2018

(86) PCT No.: PCT/US2018/057273
§ 371 (c)(1),
(2) Date: Aug. 30, 2019

(87) PCT Pub. No.: WO2019/084112
PCT Pub. Date: May 2, 2019

(65) Prior Publication Data
US 2020/0094468 A1    Mar. 26, 2020

Related U.S. Application Data

(60) Provisional application No. 62/578,008, filed on Oct. 27, 2017.

(51) Int. Cl.
*B29C 64/124* (2017.01)
*B33Y 10/00* (2015.01)
(Continued)

(52) U.S. Cl.
CPC .......... *B29C 64/124* (2017.08); *B29C 64/245* (2017.08); *B29C 64/321* (2017.08);
(Continued)

(58) Field of Classification Search
CPC ... B29C 64/124; B29C 64/321; B29C 64/364; B29C 64/245; B29C 64/255; B33Y 10/00; B33Y 30/00; B33Y 40/00
See application file for complete search history.

(56) References Cited

U.S. PATENT DOCUMENTS

| 2016/0160077 A1 * | 6/2016 | Rolland | C08G 18/4825 |
| | | | 428/36.9 |
| 2016/0303795 A1 * | 10/2016 | Liu | B29C 64/25 |
| 2019/0092951 A1 * | 3/2019 | Wang | B29C 64/124 |

FOREIGN PATENT DOCUMENTS

| WO | 2015/164234 | 10/2015 |
| WO | 2016/149104 | 9/2016 |
| WO | 2017/053783 | 3/2017 |

OTHER PUBLICATIONS

International Search Report and Written Opinion for PCT/US2018/057273 dated Jan. 22, 2019, 12 pages.

* cited by examiner

*Primary Examiner* — Jacob T Minskey
*Assistant Examiner* — S. Behrooz Ghorishi
(74) *Attorney, Agent, or Firm* — Myers Bigel, P.A.

(57) ABSTRACT

An apparatus for producing a three-dimensional object by additive manufacturing includes a drive assembly operatively associated with a carrier and a window mount and configured to advance the carrier and the window mount away from one another. A first fluid switch is connected to a first fluid orifice when a window is present, or connected to the window mount and configured for connection to the window when the window is absent. A second fluid switch is connected to a second fluid orifice when the window is present, or connected to the window mount and configured for connection to the window when the window is absent. A (Continued)

fluid supply is connected to both the first and second fluid switch, and the fluid includes a polymerization inhibitor.

7 Claims, 3 Drawing Sheets

(51) Int. Cl.
  *B33Y 30/00* (2015.01)
  *B33Y 40/00* (2020.01)
  *B29C 64/321* (2017.01)
  *B29C 64/364* (2017.01)
  *B29C 64/245* (2017.01)
(52) U.S. Cl.
  CPC ............ *B29C 64/364* (2017.08); *B33Y 10/00* (2014.12); *B33Y 30/00* (2014.12); *B33Y 40/00* (2014.12)

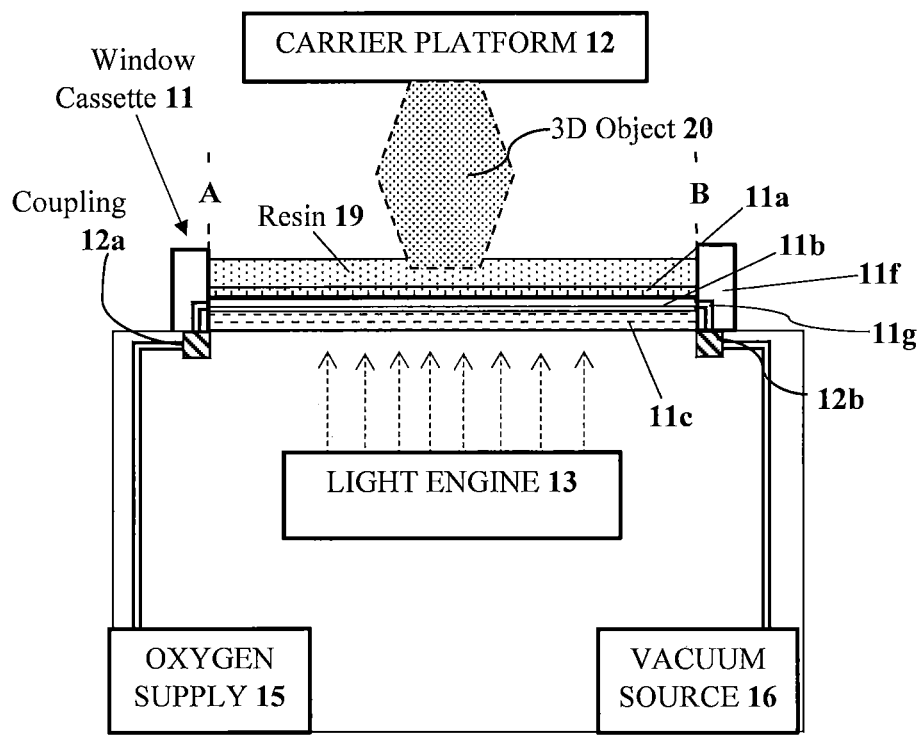
FIGURE 1 (Comparative)
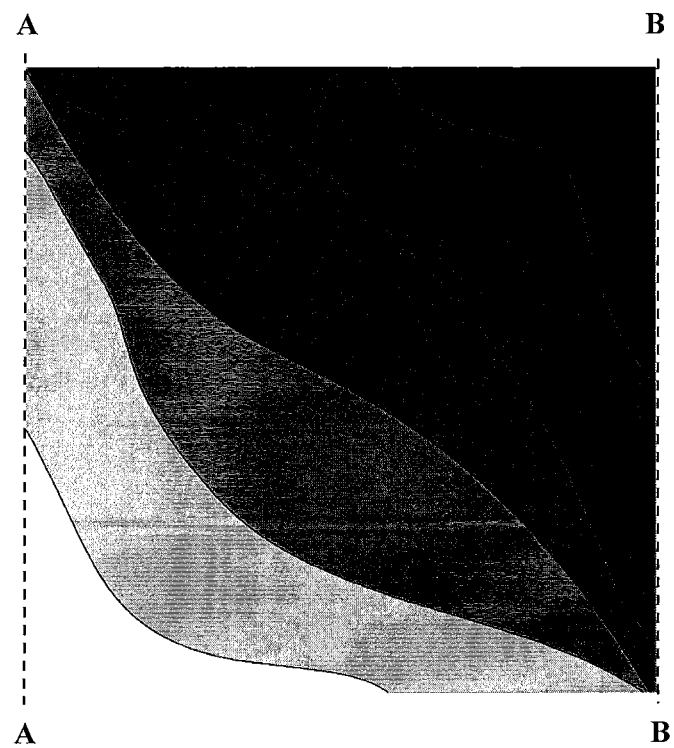
FIGURE 2 (Comparative)

us 11,400,644 B2

REDUCTION OF POLYMERIZATION INHIBITOR IRREGULARITY ON ADDITIVE MANUFACTURING WINDOWS

RELATED APPLICATIONS

This application is a 35 U.S.C. § 371 national phase entry of International Application No. PCT/US2018/057273, filed Oct. 24, 2018, which claims priority U.S. Provisional Application Ser. No. 62/578,008, filed Oct. 27, 2017, the disclosures of which are incorporated by reference herein in their entireties.

FIELD OF THE INVENTION

The present invention concerns additive manufacturing, particularly stereolithography, including continuous liquid interface production (CLIP).

BACKGROUND OF THE INVENTION

A group of additive manufacturing techniques sometimes referred to as "stereolithography" create a three-dimensional object by the sequential polymerization of a light polymerizable resin. Such techniques may be "bottom-up" techniques, where light is projected into the resin onto the bottom of the growing object through a light transmissive window, or "top down" techniques, where light is projected onto the resin on top of the growing object, which is then immersed downward into the pool of resin.

The recent introduction of a more rapid stereolithography technique known as continuous liquid interface production (CLIP), coupled with the introduction of "dual cure" resins for additive manufacturing, has expanded the usefulness of stereolithography from prototyping to manufacturing (see, e.g., U.S. Pat. Nos. 9,211,678; 9,205,601; and 9,216,546 to DeSimone et al.; and also in J. Tumbleston, D. Shirvanyants, N. Ermoshkin et al., Continuous liquid interface production of 3D Objects, Science 347, 1349-1352 (published online 16 Mar. 2015); see also Rolland et al., U.S. Pat. Nos. 9,676,963, 9,453,142 and 9,598,606).

Techniques such as CLIP harness inhibitors of polymerization such as oxygen to the benefit of the stereolithography process. However, the inhibitors can be consumed, and when consumed must be re-supplied, particularly when the process is operated rapidly. And rapid operation of the process can lead to seemingly unrelated additional problems, such as cavitation and bubble formation in the polymerizable liquid beneath the growing three-dimensional object, leading to defect formation within the object itself. Accordingly, a need remains for new techniques in bottom-up stereolithography.

SUMMARY

In some embodiments, an apparatus for producing a three-dimensional object by additive manufacturing includes (a) a light source; (b) a carrier or carrier mount positioned above the light source, on which carrier a three-dimensional object can be produced; (c) a window mount; (d) optionally, a fixed or removable window cassette connected to the window mount; the window comprising: (i) an optically transparent semipermeable member, on which member a three-dimensional object can be produced; (ii) a fluid supply bed in or adjacent the semipermeable member and configured to feed a polymerization inhibitor through the semipermeable member, the supply bed having at least two opposing sides; (iii) at least a first and second fluid orifice connected to the supply bed on opposite sides thereof and in fluid communication with one another through the supply bed; (e) a drive assembly operatively associated with the carrier and the window mount (and the window cassette when present) and configured to advance the carrier and the window mount (and the window cassette when present) away from one another; (f) a first fluid switch connected to the first fluid orifice when the window is present, or connected to the window mount and configured for connection to the window when the window is absent; (g) a second fluid switch connected to the second fluid orifice when the window is present, or connected to the window mount and configured for connection to the window when the window is absent; (f) a fluid supply connected to both the first and second fluid switch, the fluid comprising a polymerization inhibitor (e.g., oxygen); and (g) optionally, a vacuum source connected to both the first and second fluid switch.

In some embodiments, the first and second fluid switches are together configured to be switchable between: (i) a first configuration in which: the fluid inhibitor supply is in fluid communication with the first fluid orifice; and the vacuum source, if present, is in fluid communication with the second fluid orifice; and (ii) a second configuration in which: the fluid inhibitor supply is in fluid communication with the second fluid orifice; and the vacuum source, if present, is in fluid communication with the first fluid orifice.

In some embodiments, the fluid supply bed comprises a lateral flow bed (e.g., positioned between a semipermeable member and an impermeable member) (e.g., a fluid channel bed).

In some embodiments, the vacuum source is present.

In some embodiments, the fluid comprises a gas.

In some embodiments, the polymerization inhibitor comprises oxygen.

In some embodiments, the fluid comprises an oxygen-enriched gas at a pressure less than atmospheric pressure.

In some embodiments, the window cassette is present.

In some embodiments, the window cassette is absent.

In some embodiments, the semipermeable member comprises an amorphous fluoropolymer.

In some embodiments, a method of reducing irregularity of an oxygen gradient across the window of a bottom-up additive manufacturing apparatus during production of a three-dimensional object thereon includes (a) producing the object from a polymerizable liquid on a window, the window comprising: (i) an optically transparent semipermeable member, on which member the three-dimensional object is produced; (ii) a fluid supply bed in or adjacent the semipermeable member, from which supply bed a polymerization inhibitor is fed through the semipermeable member; (iii) at least a first and second fluid orifice connected to the supply bed on opposite sides thereof and in fluid communication with one another through the supply bed; while (b) feeding a fluid comprising a polymerization inhibitor (e.g., oxygen) through one of the orifices, optionally while drawing a vacuum through the other of the orifices; and (c) periodically reversing the flow of the fluid through the supply bed.

In some embodiments, the fluid supply bed comprises a lateral flow bed (e.g., positioned between a semipermeable member and an impermeable member) (e.g., a fluid channel bed).

In some embodiments, the step of drawing a vacuum is present.

In some embodiments, the periodically reversing step is carried out by (i) periodically switching the orifice through which the inhibitor of polymerization is fed, and (ii) the orifice from which the vacuum, if present, is drawn.

In some embodiments, the fluid comprises a gas.

In some embodiments, the fluid comprises an oxygen-enriched gas at a pressure less than atmospheric pressure.

In some embodiments, the pressure of the oxygen-enriched gas is substantially equal to a partial pressure of oxygen in air at atmospheric pressure.

In some embodiments, the step of drawing a vacuum is applied intermittently.

In some embodiments, the polymerizable liquid comprises a lower region on the optically transparent member, and an upper region on the lower region opposite the optically transparent member, wherein the step of applying a reduced pressure and/or polymer inhibitor-enriched gas to the polymerizable liquid through the optically transparent member comprises reducing a gas (e.g., nitrogen) concentration in the upper region.

In some embodiments, a thickness of the lower region is about 1 to 1000 microns.

In some embodiments, the step of intermittently applying a reduced pressure to the polymerizable liquid through the optically transparent member is sufficient to reduce a gas (e.g., nitrogen) concentration in the upper region and maintain a gas (e.g., oxygen) concentration in the lower region.

In some embodiments, the step of periodically switching is carried out at a frequency of from 0.01, 0.02, or 0.1 Hertz, up to 0.2, 0.5, 1, or 2 Hertz.

The foregoing and other objects and aspects of the present invention are explained in greater detail in the drawings herein and the specification set forth below. The disclosures of all United States patent references cited herein are to be incorporated herein by reference.

BRIEF DESCRIPTION OF THE DRAWINGS

FIG. 1 schematically illustrates, for comparative purposes, a bottom-up stereolithography apparatus in which a fluid comprising a polymerization inhibitor is flowed laterally beneath a semipermeable window.

FIG. 2 is a top down view of a window of an apparatus of FIG. 1, with darker regions showing regions of polymerizable liquid in which oxygen is depleted, and hence susceptible to collapse of the sustained liquid interface release layer (or "dead zone").

DETAILED DESCRIPTION OF ILLUSTRATIVE EMBODIMENTS

Figure 3:
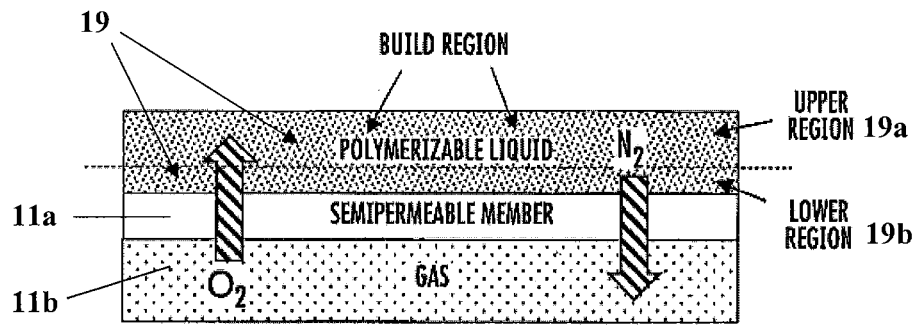
FIG. 3 is a side-sectional view of a window for a bottom-up stereolithography apparatus in which oxygen is passed through the window into the polymerizable liquid, showing that, as oxygen concentration in the polymerizable liquid is increased, nitrogen concentration (responsible for undesirable bubble formation in objects being produced) is also advantageously reduced.

The present invention is now described more fully hereinafter with reference to the accompanying drawings, in which embodiments of the invention are shown. This invention may, however, be embodied in many different forms and should not be construed as limited to the embodiments set forth herein; rather these embodiments are provided so that this disclosure will be thorough and complete and will fully convey the scope of the invention to those skilled in the art.

Like numbers refer to like elements throughout. In the figures, the thickness of certain lines, layers, components, elements or features may be exaggerated for clarity. Where used, broken lines illustrate optional features or operations unless specified otherwise.

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises" or "comprising," when used in this specification, specify the presence of stated features, integers, steps, operations, elements components and/or groups or combinations thereof, but do not preclude the presence or addition of one or more other features, integers, steps, operations, elements, components and/or groups or combinations thereof.

As used herein, the term "and/or" includes any and all possible combinations or one or more of the associated listed items, as well as the lack of combinations when interpreted in the alternative ("or").

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and claims and should not be interpreted in an idealized or overly formal sense unless expressly so defined herein. Well-known functions or constructions may not be described in detail for brevity and/or clarity.

It will be understood that when an element is referred to as being "on," "attached" to, "connected" to, "coupled" with, "contacting," etc., another element, it can be directly on, attached to, connected to, coupled with and/or contacting the other element or intervening elements can also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature can have portions that overlap or underlie the adjacent feature.

Spatially relative terms, such as "under," "below," "lower," "over," "upper" and the like, may be used herein for ease of description to describe an element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus the exemplary term "under" can encompass both an orientation of over and under. The device may otherwise be oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only, unless specifically indicated otherwise.

It will be understood that, although the terms first, second, etc., may be used herein to describe various elements, components, regions, layers and/or sections, these elements, components, regions, layers and/or sections should not be limited by these terms. Rather, these terms are only used to distinguish one element, component, region, layer and/or section, from another element, component, region, layer and/or section. Thus, a first element, component, region, layer or section discussed herein could be termed a second element, component, region, layer or section without departing from the teachings of the present invention. The sequence of operations (or steps) is not limited to the order presented in the claims or figures unless specifically indicated otherwise.

1. Additive Manufacturing Methods and Apparatus

Additive manufacturing apparatus and methods are known. Suitable apparatus includes bottom-up apparatus that employ a window, or optically transparent member or "build plate," on which a pool of polymerizable liquid sits, and through which patterned light is projected to produce a three-dimensional object. Such methods and apparatus are known and described in, for example, U.S. Pat. No. 5,236,637 to Hull, U.S. Pat. Nos. 5,391,072 and 5,529,473 to Lawton, U.S. Pat. No. 7,438,846 to John, U.S. Pat. No. 7,892,474 to Shkolnik, U.S. Pat. No. 8,110,135 to El-Siblani, U.S. Patent Application Publication Nos. 2013/0292862 to Joyce, and US Patent Application Publication No. 2013/0295212 to Chen et al. The disclosures of these patents and applications are incorporated by reference herein in their entirety.

CLIP is known and described in, for example, U.S. Pat. Nos. 9,211,678; 9,205,601; and 9,216,546 to DeSimone et al.; and also in J. Tumbleston, D. Shirvanyants, N. Ermoshkin et al., Continuous liquid interface production of 3D Objects, *Science* 347, 1349-1352 (published online 16 Mar. 2015). See also R. Janusziewcz et al., Layerless fabrication with continuous liquid interface production, *Proc. Natl. Acad. Sci. USA* 113, 11703-11708 (Oct. 18, 2016). In some embodiments, CLIP employs features of a bottom-up three dimensional fabrication as described above, but the irradiating and/or the advancing steps are carried out while also concurrently maintaining a stable or persistent liquid interface between the growing object and the build surface or window, such as by: (i) continuously maintaining a dead zone of polymerizable liquid in contact with the build surface, and (ii) continuously maintaining a gradient of polymerization zone (such as an active surface) between the dead zone and the solid polymer and in contact with each thereof, the gradient of polymerization zone comprising the first component in partially cured form. In some embodiments of CLIP, the optically transparent member comprises a semipermeable member (e.g., a fluoropolymer), and the continuously maintaining a dead zone is carried out by feeding an inhibitor of polymerization through the optically transparent member, thereby creating a gradient of inhibitor in the dead zone and optionally in at least a portion of the gradient of polymerization zone. The particular manner of description is not critical, and the present invention can be used in any of a variety of systems that employ a semipermeable build plate, through which an inhibitor of polymerization passes, whether explicitly referred to as "CLIP" or not.

The apparatus can include a local controller that contains and executes operating instructions for the production of a three dimensional object on that apparatus, typically from an object data file entered into the controller by the user. Along with the basic three-dimensional image of the object that is typically projected for photopolymerization (along with movement of the carrier and build surface away from one another in the Z direction), the operating instructions can include or generate process parameters such as: light intensity; light exposure duration; inter-exposure duration; speed of production; step height; height and/or duration of upstroke in a stepped or reciprocal operating mode; height and/or duration of downstroke in a reciprocal operating mode; rotation speed for pumping viscous polymerizable liquid; resin heating temperature; and/or resin cooling temperature; rotation speed and frequency, etc. (see, e.g., Ermoshkin et al., *Three-dimensional printing with reciprocal feeding of polymerizable liquid* PCT Patent Application Pub. No. WO 2015/195924 (published 23 Dec. 2015); Sutter et al., *Fabrication of three dimensional objects with multiple operating modes*, PCT Patent Application Publication No. WO 2016/140886 (published 9 Sep. 2016); J. DeSimone et al., *Methods and apparatus for continuous liquid interface production with rotation*, PCT Patent Application WO 2016/007495 (published 14 Jan. 2016); see also J. DeSimone et al., U.S. Pat. No. 9,211,678, and J. Batchelder et al., Continuous liquid interface production system with viscosity pump, US Patent Application Publication No. US 2017/0129169 (published 11 May 2017).

In one non-limiting embodiment, the apparatus may be a Carbon Inc., M1 or M2 additive manufacturing apparatus, available from Carbon, Inc., 1089 Mills Way, Redwood City, Calif. 94063 USA.

Numerous resins for use in additive manufacturing are known and can be used in carrying out the present invention. See, e.g., U.S. Pat. No. 9,205,601 to DeSimone et al.

In some embodiments, the resin is a dual cure resin. Such resins are described in, for example, Rolland et al., U.S. Pat. Nos. 9,676,963; 9,598,606; and 9,453,142, the disclosures of which are incorporated herein by reference.

Resins may be in any suitable form, including "one pot" resins and "dual precursor" resins (where cross-reactive constituents are packaged separately and mixed together before use, and which may be identified as an "A" precursor resin and a "B" precursor resin).

Particular examples of suitable resins include, but are not limited to, Carbon, Inc. rigid polyurethane resin (RPU), flexible polyurethane resin (FPU), elastomeric polyurethane resin (EPU), cyanate ester resin (CE), epoxy resin (EPX), or urethane methacrylate resin (UMA), all available from Carbon, Inc., 1089 Mills Way, Redwood City, Calif. 94063 USA.

2. Build Plates

In general, a build plate for use in the present invention may comprise any suitable semipermeable or permeable material (that is, permeable to the polymerization inhibitor) including amorphous fluoropolymers, such as an amorphous thermoplastic fluoropolymer like TEFLON AF 1600™ or TEFLON AF 2400™ fluoropolymer films, or perfluoropolyether (PFPE), particularly a crosslinked PFPE film, or a crosslinked silicone polymer film. Beneath that may be a fluid bed layer, such as provided by a gas permeable material, optionally containing channels or cavities, such as a permeable polymer (e.g., poly(dimethylsiloxane) (PDMS). A base or support member (such as glass or sapphire) may be included at the bottom of the window if necessary, and may serve to further define the fluid supply bed. The build plate may be supported by a peripheral frame, with the two together forming a removable window cassette as discussed below.

In some embodiments, the pressure and gas supply to the build plate may be controlled to reduce bubble or voids formed by excess gasses, such as nitrogen, in the polymerizable fluid (e.g., resin) of in the 3D printing process and apparatus. Although the methods described herein may be performed by controlling a pressure and/or content of the gas supplied to the build plate using a pressure controller/gas supply, it should be understood that any suitable system may be used, including alternative build plates. For example, any permeable build plate may be positioned such that the side opposite the build surface is in a pressure-controlled chamber, or any suitable configuration of pressure-pressure controlled channels may be used.

The amount and duration of the reduced pressure applied to the polymerizable liquid through the optically transparent member is preferably sufficient to reduce a gas concentration in the polymerizable liquid. The pressure may be at 0%, 5%, 10%, 20%, 25%, 30%, 40% to 50%, 60%, 70%, 80%, 90% or 100% of atmospheric pressure. The oxygen or polymerization inhibitor gas composition of the gas supplied may be 20%, 25%, 30%, 40% to 50%, 60%, 70%, 80%, 90% or 100% oxygen.

In some embodiments, the polymerizable fluid has a gradient of gas concentration, which determines an amount of irradiation or "dose" to cure the polymerizable liquid. For example, the polymerizable fluid can have a lower region on the optically transparent member, and an upper region on the lower region opposite the optically transparent member such that the lower region has a higher dose to cure than the upper region. The applied reduced pressure to the polymerizable liquid through the optically transparent member may reduce a gas concentration in the upper region, while maintaining the polymerization inhibitor gas in the lower region, which consequently reduces a thickness of the dead zone. In some embodiments, the thickness of the lower region is less than about 1000 microns or between about 1, 2, 5, 10, 20 50, 100, 200 300 to 400, 500, 600, 700, 800, 900 or 1000 microns.

In some embodiments, oxygen gas may be used as the polymerization inhibitor. Oxygen may be supplied at any suitable pressure, and is preferably supplied at a pressure that is less than atmospheric pressure. In particular embodiments, the pressure of the oxygen is substantial equal to a partial pressure of oxygen in air at atmospheric pressure (e.g., 100% oxygen supplied at about 0.2 atm). The polymerization inhibitor gas may also be substantially devoid of nitrogen or other gases that do not substantially contribute to polymerization inhibition in the dead zone.

Without wishing to be bound by any particular theory, resins that are saturated with gas are prone to degassing when the local pressure drops. Large pressure drops can occur during the build platform movement and resin refill. When the separation of the printed part and window result in gas coalescence, voids may be formed in the printed part. Accordingly, controlling the pressure of a gas or applying a vacuum through the gas permeable build plate may reduce the level of dissolved gases prior to the pressure change, and reducing an amount of dissolved gas may increase the pressure differential that the resin can experience prior to void formation. The build plate is permeable to gasses, and equilibrium may be established at the build plate/resin interface relatively quickly. Cycling between air (or oxygen) and vacuum for printing formation and part movement, respectively, may permit the CLIP process to be performed with a maximum pressure differential on the resin prior to void formation the part. Moreover, the removal of nitrogen, which is not an active component of polymerization inhibition, may reduce the overall gas level and further reduce the formation of bubbles or voids in the printed part.

In addition, while oxygen delivery to the interface between the polymerizable fluid and the build plate is desirable, oxygen in the regions of the polymerization fluid that are further away from the interface may lead to a larger dosage of irradiation to cure the polymerizable fluid, which results in a longer exposure time and slower print speeds. Reducing the overall oxygen level may lead to faster cure times, by may lead to difficulty maintaining sufficient oxygen at the interface for the CLIP process to be effective. Moreover, since the light intensity decays as it passes through the polyermization fluid, the percent monomer to polymer conversions may not be constant throughout the exposed region. Controlling a level of oxygen concentration may reduce exposure times and increase print speeds by effectively maintaining a level of oxygen at the build plate and polymerization fluid interface. The oxygen concentration profile may also be controlled to provide more consistent percent monomer to polymer conversions in view of variations of light intensity.

Additional Build Plate Materials. Any suitable material may be used to form the build plates described herein, including multi-layer build plates and/or build plates formed of more than one material. For example, the flexible layer (used alone or with additional supports or layers) may include a woven glass fabric (fiberglass or e-glass) with a crosslinked silicone elastomeric coating (such as room temperature vulcanized (RTV) silicone), which may be lightly infiltrated into the glass fiber fabric to provide mechanical durability. The oxygen permeability of silicone elastomer (rubber) is similar to Teflon® AF-2400. Such a configuration may be used alone or affixed (adhesively adhered) to a glass plate with the unfilled areas of the fabric available for air (oxygen) flow. Sulfonated tetrafluoroethylene based fluoropolymer-copolymers, such as Nafion® from Dupont may also be used.

In some embodiments, asymmetric flat sheet membranes which are currently used in very high quantity for water purification applications (see U.S. Patent Publication No. 2014/0290478) may be used. These membranes are generally polysulfone or polyethersulfone, and may be coated with perfluoropolymers or crosslinked silicone elastomer to increase chemical resistance. Also poly(vinylidene fluoride) and possibly polyimide asymmetric (porous) membranes may be used, for example, if chemical resistance is a problem. Some of the membranes may be used as is without coatings. Examples of such membranes include FilmTec® membranes (Dow Chemical, Midland, Mich. (USA)). These are porous polysulfone asymmetric membranes coated with a crosslinked high Tg polyamide (with a coating thickness of about 0.1 microns). The crosslinked polyamide coating should provide chemical resistance. Although the oxygen permeability of the polyamide is low, the thickness of the coating may be so low that the effective oxygen transmission rate is high. The polysulfone support without the polyamide layer could be coated with a wide variety of polymers such as silicone rubber (or AF-2400) to yield very high oxygen transmission. The FilmTec® membranes are produced in very high quantity as they are the prime material used in water desalination plants. PVDF porous membranes may allow repeated use.

Although embodiments according to the present invention are described with respect to flexible layers on the build plate that include a semipermeable (or gas permeable) member (e.g., perfluoropolymers, such as TEFLON AF® fluoropolymers, it should be understood that any suitable flexible material may be used in the configurations described herein. For example, a transparent, resilient paper, such as glassine, may be used. Glassine is a relatively transparent, greaseproof paper formed of well-hydrated cellulosic fibers that has been super calendared. Glassine may be plasticized and/or coated with wax or a glaze. Glassine may be gas permeable. In some embodiments, the glassine may be coated with a thin layer of crosslinked silicone elastomer or a perfluoropolymer, such as TEFLON AF® fluoropolymers. Glassine paper is substantially grease resistant, and may have limited adhesion to the polymerizable liquid described herein.

Build plate coatings. Omniphobic surfaces may be used on the build plate surface or build region. For example, patterned surfaces (either a random array of particles or micro patterned surfaces) that contain non-miscible fluids that are pinned or held to the surface by capillary forces may be used. Such a surface may result in fluid on the surface floating along the surface. Examples of such surfaces are described in U.S. Pat. Nos. 8,535,779 and 8,574,704, the disclosures of which are hereby incorporated by reference in their entireties.

Examples of build plates that can be used to carry out the present invention include, but are not limited to, those described in: U.S. Pat. No. 9,498,920 to J. DeSimone, A. Ermoshkin, and E. Samulski; U.S. Pat. No. 9,360,757 to J. DeSimone, A. Ermoshkin, N. Ermoshkin and E. Samulski; and U.S. Pat. No. 9,205,601 to J. DeSimone, A. Ermoshkin, N. Ermoshkin and E. Samulski; US Patent Application Publication Nos. US 2016/0046075 to J. DeSimone, A. Ermoshkin et al.; US 2016/0193786 to D. Moore, A. Ermoshkin et al.; US 2016/0200052 to D. Moore, J. Tumbleston et al.; PCT Patent Application Publication Nos. 2016/123499 to D. Moore, J. Tumbleston et al; WO 2016/123506 to D. Moore, J. Tumbleston et al.; WO 2016/149097 to J. Tumbleston, E. Samulski et al.; WO 2016/149014 to J. Tumbleston, E. Samulski et al.; and others (the disclosures of all of which are incorporated by reference herein in their entirety).

3. Example Apparatus and Methods

FIG. 1 shows a bottom-up stereolithography apparatus without flow switching. The apparatus includes a removable window cassette 11, a carrier platform 12, and a light engine 13. A 3D object 20 is produced on the object from a polymerizable liquid (or "resin") 19. Drives, controllers, and the like are not shown for clarity but are implemented in accordance with known techniques.

The removable window cassette includes a semipermeable member 11a, a fluid bed layer or region 11b, and an optional support member 11c, all supported by a circumferential frame 11f. Other aspects and features of the window cassette may be as described above.

The apparatus includes an oxygen supply 15 and a vacuum source 16, which through couplings 12a, 12b, connect to the window cassette 11, and particularly to the fluid bed region 11b, through inlets 11g within the frame 11f. Inlets may include associated header regions to facilitate fluid flow and distribution, as is known in the art. As illustrated, there is an inlet region and an outlet region flowing from one side of the window to the other A, B.

FIG. 2 illustrates oxygen depletion in a polymerizable liquid resting on top of a window in an apparatus of FIG. 1, with progressively darker regions indicating progressively more oxygen depleted regions. As is apparent, oxygen depletion is highly irregular, and as noted above and further illustrated in the side view of FIG. 3, with oxygen depletion (and the associated risk of "dead zone" failure and consequent production failure), comes the risk of excess nitrogen in the polymerizable liquid leading to bubble formation in the object being produced.

Figure 4:
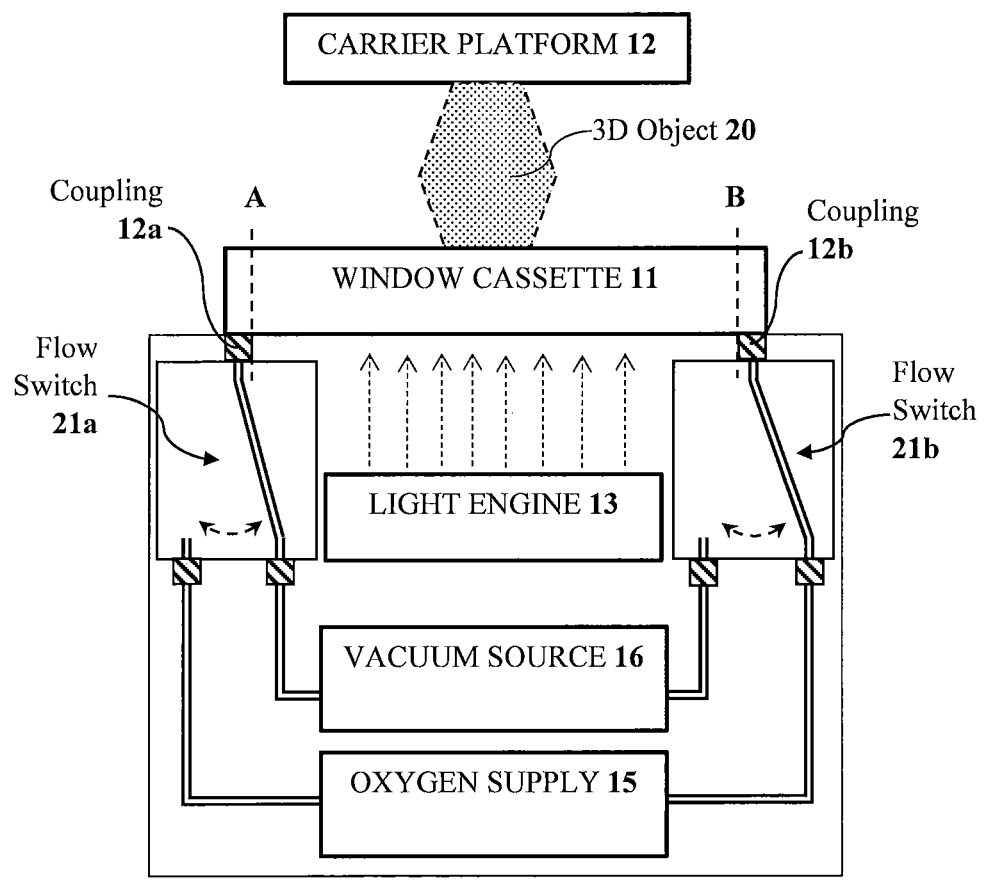
FIG. 4 is a schematic illustration of an apparatus of the present invention.
Figure 5:
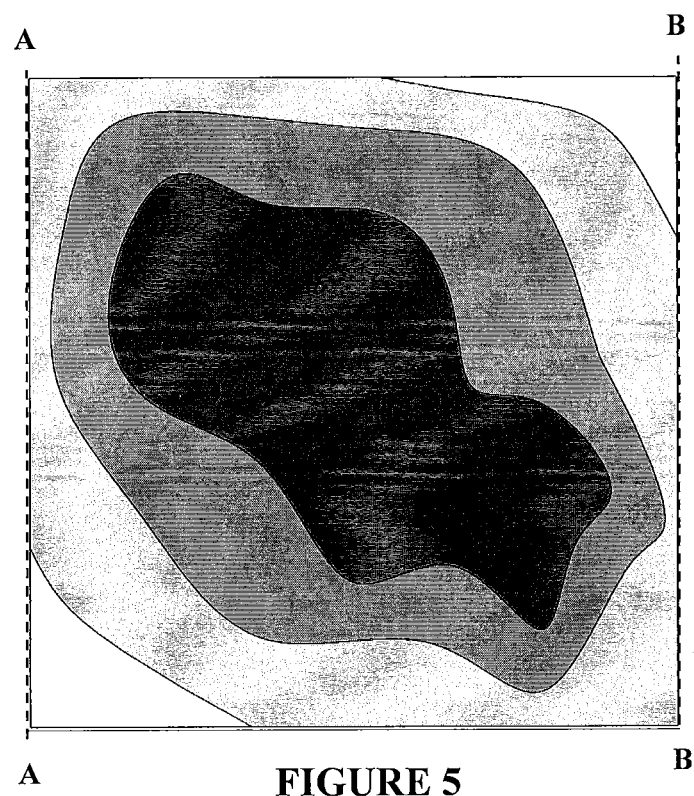
FIG. 5 is similar to FIG. 2, except taken from an apparatus of FIG. 4. Note the absence of highly oxygen-depleted regions.

FIG. 4 illustrates an apparatus like that of FIG. 1 with similar elements having similar numbers assigned thereto. The internal structure of the window cassette 11 may be the same as that shown in FIG. 1. However, this apparatus has a pair of flow switch valves 21a, 21b, connected to each coupling. Any suitable valve may be used, including 3-port solenoid valves, such as an SMC part number NVKF334V-5GS-01T valve, available from SMC Pneumatics, 3810 Prospect Ave., Unit A, Yorba Linda, Calif. 92886 USA. By periodically switching the direction of flow of the fluid comprising the polymerization inhibitor, the degree of oxygen depletion can be made more uniform across the window, as illustrated in FIG. 5. The frequency of switching will depend on factors such as the amount of oxygen in the fluid, the internal volume of the fluid bed in the window, the pressure of the fluid in the bed, the proximity of the flow switches to the window cassette (with close proximity generally preferred), the speed of object production, and the configuration and density of the object being produced, but in general will be about 0.01, 0.02, or 0.1 Hertz, up to 0.2, 0.5, 1, or 2 Hertz (that is, flow switches per second), or more, or less.

The foregoing is illustrative of the present invention, and is not to be construed as limiting thereof. The invention is defined by the following claims, with equivalents of the claims to be included therein.

We claim:

1. An apparatus for producing a three-dimensional object by additive manufacturing, comprising:
   (a) a light source;
   (b) a carrier or carrier mount positioned above said light source, on which carrier the three-dimensional object can be produced;
   (c) a window mount;
   (d) a window cassette that is fixed or removably connected to said window mount; said window cassette comprising:
      (i) an optically transparent semipermeable member, on which the three-dimensional object can be produced;
      (ii) a fluid supply bed in or adjacent said semipermeable member and configured to feed a polymerization inhibitor through said semipermeable member, said fluid supply bed having at least two opposing sides;
      (iii) at least a first and second fluid orifice connected to said fluid supply bed on opposite sides thereof and in fluid communication with one another through said fluid supply bed;
   (e) a drive assembly operatively associated with said carrier and said window mount, and said window cassette, and configured to advance said carrier and said window mount away from one another;
   (f) a first fluid switch connected to said first fluid orifice;
   (g) a second fluid switch connected to said second fluid orifice;
   (h) a fluid inhibitor supply connected to both said first and second fluid switch, said fluid inhibitor supply comprising said polymerization inhibitor; and
   (j) optionally, a vacuum source connected to both said first and second fluid switch
   wherein said first and second fluid switches are together configured to be periodically switched between:

(i) a first configuration in which: said fluid inhibitor supply is in fluid communication with said first fluid orifice; and said vacuum source, if present, is in fluid communication with said second fluid orifice, and said polymerization inhibitor flows in a first direction from said first fluid orifice on a first side of said fluid supply bed to said second fluid orifice on an opposing second side of said fluid supply bed, wherein said polymerization inhibitor exits said fluid supply bed at said second fluid orifice; and (ii) a second configuration in which: said fluid inhibitor supply is in fluid communication with said second fluid orifice; and said vacuum source, if present, is in fluid communication with said first fluid orifice, and said polymerization inhibitor flows in a second direction, opposite said first direction, from said second fluid orifice on said second side of said fluid supply bed to said first fluid orifice on said first side of said fluid supply bed, wherein said polymerization inhibitor exits said fluid supply bed at said first fluid orifice.

2. The apparatus of claim 1, wherein said fluid supply bed comprises a lateral flow bed.

3. The apparatus of claim 1, wherein said vacuum source is present.

4. The apparatus of claim 1, wherein said polymerization inhibitor comprises a gas.

5. The apparatus of claim 1, wherein said polymerization inhibitor comprises oxygen.

6. The apparatus of claim 1, wherein said polymerization inhibitor comprises an oxygen-enriched gas at a pressure less than atmospheric pressure.

7. The apparatus of claim 1, wherein said semipermeable member comprises an amorphous fluoropolymer.

* * * * *